United States Patent [19]

Bogus

[11] Patent Number: 5,542,988
[45] Date of Patent: Aug. 6, 1996

[54] PHOTOCELL, ITS METHOD OF MANUFACTURE, AND A SOLAR PANEL COMPRISING SUCH CELLS

[75] Inventor: Klaus P. M. Bogus, Voorschoten, Netherlands

[73] Assignee: Agence Spatiale Europeene, Paris Cedex, France

[21] Appl. No.: 325,451

[22] PCT Filed: Feb. 15, 1994

[86] PCT No.: PCT/FR94/00163

§ 371 Date: Oct. 17, 1994

§ 102(e) Date: Oct. 17, 1994

[87] PCT Pub. No.: WO94/19831

PCT Pub. Date: Sep. 1, 1994

[30] Foreign Application Priority Data

Feb. 17, 1993 [FR] France ................................. 93 01761

[51] Int. Cl.$^6$ ............................. H01L 31/42; H01L 31/04
[52] U.S. Cl. ......................... 136/244; 136/256; 136/292; 437/2
[58] Field of Search ..................... 136/244–245, 136/256, 292; 437/2–5

[56] References Cited

U.S. PATENT DOCUMENTS

| 3,912,540 | 10/1975 | Broder | 136/256 |
| 4,832,755 | 5/1989 | Barton et al. | 136/251 |
| 4,849,028 | 7/1989 | Krause | 136/259 |
| 4,915,743 | 4/1990 | Schilling | 136/256 |

FOREIGN PATENT DOCUMENTS

| 3733645A1 | 4/1989 | Germany | 136/244 |
| 3914315A1 | 10/1990 | Germany | 136/244 |
| 2224391A | 5/1990 | United Kingdom | 136/244 |

OTHER PUBLICATIONS

K. L. Chopra et al, "Thin Film Solar Cells", Plenum Press, New York (1983), pp. 321–328.

D. W. Egelkrout et al, "Current Research in Adhesiveless Bonding of Cover Glasses to Solar Cells", *16th IEEE Photovoltaic Specialists Conference*, Sep. 27, 1982, pp. 108–114.

Patent Abstracts Of Japan, vol. 10, No. 32 (E–379(2089) 7 Feb. 1986 (corresponding to JPA 60 189 272.

J. Koch, "A Low Cost Anticharging Connection System for Solar Generators and Its Application on Aspera Solar Array", *European Space Power Conference*, Aug. 1989, pp. 587–590.

P. A. White et al, "Direct Glassing of Silicon Solar Cells", *20th IEEE Photovoltaic Specialists Conference*, 26 Sep. 1988, pp. 949–953.

*Primary Examiner*—Aaron Weisstuch
*Attorney, Agent, or Firm*—Sughrue, Mion, Zinn, Macpeak & Seas

[57] ABSTRACT

The present invention relates to a photocell including means for providing protection against the accumulation of electrostatic charge, to a method of manufacturing it, and to a solar panel including such cells.

A photocell of the invention includes a circuit for drawing off electrostatic charge that is efficient but is of low mass and that masks incident solar radiation very little.

The circuit for drawing off charge comprises a grid of material that is optionally transparent on the outside surface of the protective glass sheet of the photocell, said grid being connected to the cell's electrode for current collection. Advantageously, the grid of the circuit for drawing off electrostatic charge is superposed over the grid of the electrode for collecting the current generated by the photocell.

8 Claims, 2 Drawing Sheets

5,542,988

PHOTOCELL, ITS METHOD OF MANUFACTURE, AND A SOLAR PANEL COMPRISING SUCH CELLS

FIELD OF THE INVENTION

The present invention relates to a photocell including means to protect it against accumulation of electrostatic charge. The invention also relates to a method of manufacturing the cell, and to a solar panel comprising such cells.

BACKGROUND OF THE INVENTION

Conventionally, a sheet of transparent protective glass is placed over photocells, in particular photocells for use in space.

Under such circumstances, the sheet of glass is secured to the photocell by a transparent adhesive, or preferably by a thin and transparent film of polytetrafluoroethylene-fluorinatedethylenepropylene (PTFE-FEP) that is thermally fixed in the presence of a strong electric field. The sheet of glass and the fixing layer form an insulating layer that may accumulate electrostatic charge whose sudden discharge through the sheet of glass and the fixing layer, in particular when accompanied by the formation of an electric arc, runs the risk of destroying the photocell and/or of disturbing the electronic equipment of a satellite. It has thus been necessary to implement circuits for evacuating electrostatic charge from photocells designed for use in space.

In "Proceedings of European Space Power Conference" held in Madrid, Spain, 2–6 Oct. 1989. (ESA SP-294, Aug. 1989), J. W. Koch describes several types of such circuits.

Firstly, he describes a metal grid connected to ground and passing over a plurality of glass sheets for protecting photocells.

Another solution described in that article relates to connecting the outside face of the protective glass sheet to the photocell by means of a conductive transparent adhesive deposited at least over the entire outside surface of the sheet of glass and/or by a fine deposit of indium tin oxide (ITO) over the entire outside surface and sides of the photocell. Conductive deposits on the inside face of the sheet of glass can be limited to the vicinity of the connection device.

In all cases, the photocells described by J. W. Koch in ESA SP-294, August 1989, include a transparent adhesive fixing the protective glass sheet. The two examples are described in entirely separate manner and there is nothing in that article that describes or suggests the possibility of combining those two examples, and in particular of implementing a grid for evacuating electrostatic charge disposed on the outside face of the protective glass sheet and connected to circuits for collecting the photoelectric charge as produced by the photocell.

In addition, it should be observed that the photocells described in that article are designed to be carried directly on the body of a scientific satellite that is subjected to substantially constant solar illumination during a limited lifetime. Such teaching is not applicable to photocells for geostationary satellites that are periodically subjected to thermal cycles that an adhesive fixing the protective glass plate could not withstand. The photocells used for scientific satellites are extremely expensive, which makes them unsuitable for use in a telecommunications satellite.

OBJECTS AND SUMMARY OF THE INVENTION

Consequently, an object of the present invention is to provide a photocell capable of withstanding a hostile environment over long periods of time, in particular capable of being used in space. Such a cell must, inter alia, be capable of withstanding periodic changes in illumination and the resulting thermal cycles and/or exposure to solar wind generating electrostatic charge.

Another object of the present invention is to provide such a cell that has excellent photovoltaic efficiency.

Another object of the present invention is to provide a photocell of large power per unit mass and/or per unit area.

Another object of the present invention is to provide such a cell that is of moderate cost.

These objects are achieved by a photocell that includes an effective circuit for drawing off electrostatic charge, which circuit is of low mass and masks incident solar radiation very little.

The circuits for evacuating charge comprise a grid of transparent or non-transparent conductive material on the outside surface of the protective glass sheet of the photocell, said grid being connected to the cell's electrode for capturing charge. Advantageously, the grid of the circuit for evacuating electrostatic charge is superposed on the grid of the electrode for collecting the charge generated by the photocell.

The invention provides a photocell comprising:
 a photovoltaic body having a first main face carrying a first electrode for collecting charge, and a second main face opposite its first main face and carrying a second electrode for collecting charge; and
 a protective glass sheet secured to said photovoltaic body;
 the photocell including:
  a grid of conductive elements for evacuating electrostatic charge, the grid being made of substantially transparent material deposited on the outside face of the protective glass sheet.

The invention also provides a photocell wherein the substantially transparent grid of conductive elements for evacuating electrostatic charge is made of indium tin oxide.

The invention also provides a photocell wherein the conductive elements of the grid for evacuating electrostatic charge are superposed over the elements of the first electrode.

The invention also provides a photocell wherein the grid for drawing off electrostatic charge is deposited on the outside face of the protective glass sheet by vacuum evaporation.

The invention also provides a photocell wherein the protective glass sheet is secured to the photovoltaic body a film of PTFE whose thickness lies in the range 20 µm and 50 µm, and preferably in the range 25 µm to 50 µm.

The invention also provides a photocell including means for interconnecting the first electrode and the grid for drawing off electrostatic charge.

The invention also provides a photocell wherein the means for interconnecting the first electrode and the grid for drawing off electrostatic charge comprise an electrical conductor extending substantially along the entire length of the edge of the protective glass sheet and overlying a busbar of the first electrode.

The invention also provides a photocell wherein the means for interconnecting the first electrode and the grid for drawing off electrostatic charge comprise a channel section bar held resiliently on the edge of the protective glass sheet.

The invention also provides a solar panel, in particular for use in space, comprising a plurality of photocells of the invention, connected in series and/or in parallel.

The invention also provides a method of manufacturing a photocell comprising the steps consisting in:

a) depositing a thin film of PTFE between a photovoltaic body and a protective glass sheet;

b) applying an intense electric field to press the glass sheet against the photovoltaic body;

c) heating the assembly to high temperature, preferably until the protective glass sheet softens;

including the following steps prior to or during step a), consisting of:

d) fixing, on one edge of the protective glass sheet, a conductive element, in particular a bar connected to the grid for evacuating charge;

e) placing solder on the edge of the PTFE film, the melting temperature of the solder being not greater than the heating temperature during step c); and f) aligning both the solder and the conductive element connected to the grid for evacuating electrostatic charge with an element of the first electrode on the photovoltaic body, and in particular with a busbar, such that when the temperature is raised during step c), the first electrode is connected to the grid for drawing off electrostatic charge and simultaneously the photovoltaic body is secured to the protective glass sheet.

BRIEF DESCRIPTION OF THE DRAWINGS

The invention will be better understood from the following description and the accompanying drawings given as non-limiting examples, and in which.

MORE DETAILED DESCRIPTION

In FIGS. 1 to 4, the same references are used to designate the same elements.

Figure 1:
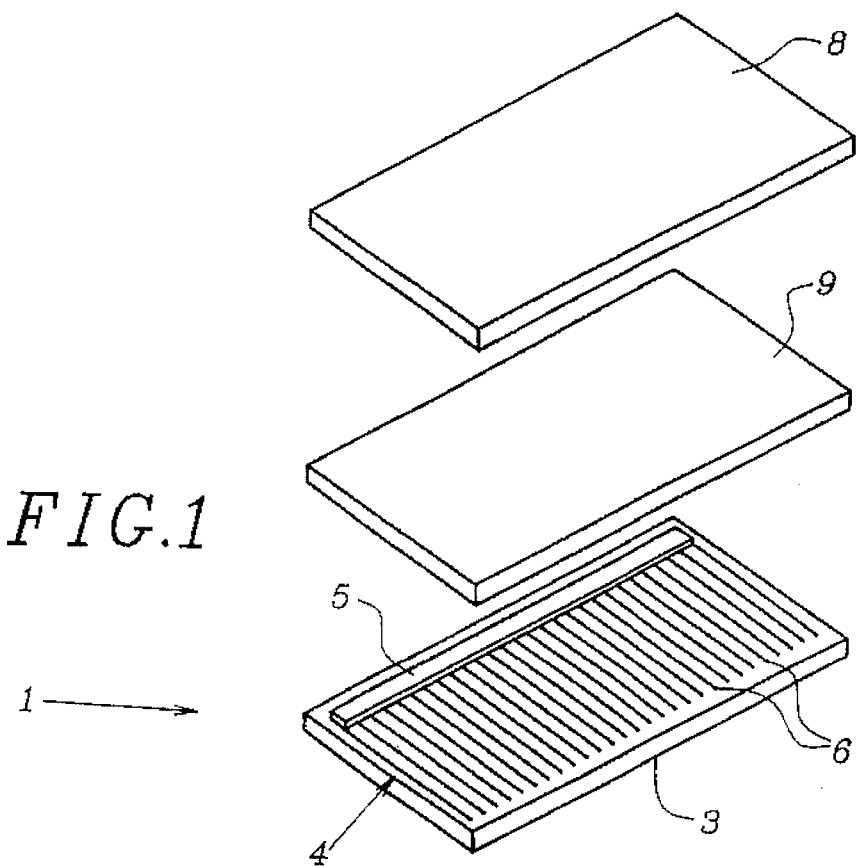
FIG. 1 is an exploded perspective view of a known type of photocell.

FIG. 1 shows an example of the semiconductor bodies that form a photocell 1 being in the shape of thin rectangular parallelepipeds having a first main face 2 designed to be illuminated by solar radiation, and a second main face 3 opposite the face 2. The photocell 1 includes a first region doped with a first conductivity type dopant extending from the first main face 2 to a PN junction situated substantially halfway through the thickness of the photocell 1, and a second region doped with a second conductivity type dopant opposite to the first conductivity type and extending from the PN junction to the second main face 3 of the photocell. The main faces 2 and 3 include electrodes for collecting charge carriers, and a potential difference is established between said electrodes when the face 2 is illuminated. In the example shown, the main face 2 includes a comb-shaped electrode 4 comprising a busbar 5 extending essentially along the entire length of a long side of the main face 2 and connected at regular intervals to linear strips 6 extending parallel to the short sides of the photocell. The electrode 4 is made of metal or advantageously it is made of a substantially transparent material such as indium tin oxide (ITO). A metal electrode 7 (FIG. 3) covers substantially the entire area of the opposite second main face 3. The photocell 1 is covered with a protective glass sheet 8 that is advantageously fixed by means of a sheet of transparent film 9 made of polytetrafluoroethylene-fluorinated-ethylenepropylene (PTFE-FEP) having a thickness that typically lies in the range 25 μm to 50 μm.

The protective glass sheet 8 is raised to a high temperature, e.g. 300° C., at which it begins to soften. The film 9 is interposed between the glass sheet 8 and the photocell 1. Advantageously, an intense electric field establishes an attractive electrostatic force between the photocell 1 and the protective glass sheet 8. Mechanical pressure is also exerted to press the protective glass sheet 8 against the photocell 1 and the assembly is allowed to cool. This method confers excellent stability and excellent lifetime to the assembled protective glass sheet 8 and photocell.

Naturally, the invention is not limited to using fixing films made of PTFE or of PTFE-FEP. For example, it is possible to use an elastomer fixing film based on silicones that are room temperature vulcanizable (RTV-adhesive), or to apply the glass sheets directly against the photocells as described in "Proceedings of the European Space Power Conference" held in Madrid, Spain, 2–6 Oct. 1989. (ESA SP-294, August 1989). Under such circumstances, sufficient reliability for space applications has been obtained only by raising the assembly constituted by the protective glass sheet pressed against the photocell to a high temperature and subjecting it to an electric field. Best results have been obtained by applying a DC voltage lying in the range 200 V to 400 V.

Figure 2:
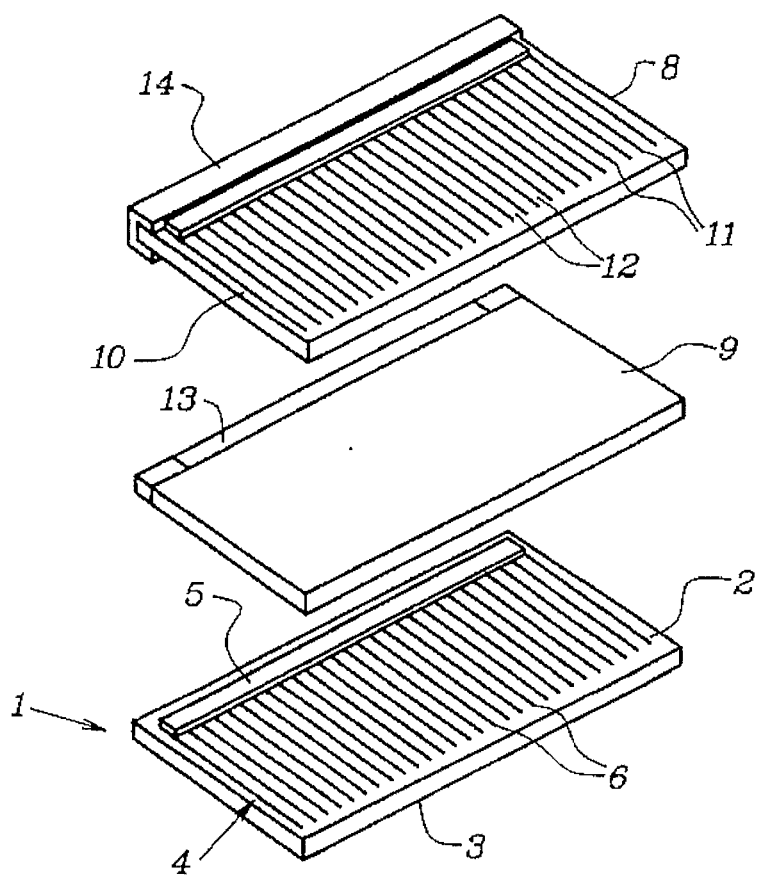
FIG. 2 is an exploded perspective view of a preferred embodiment of a cell of the present invention.
Figure 3:
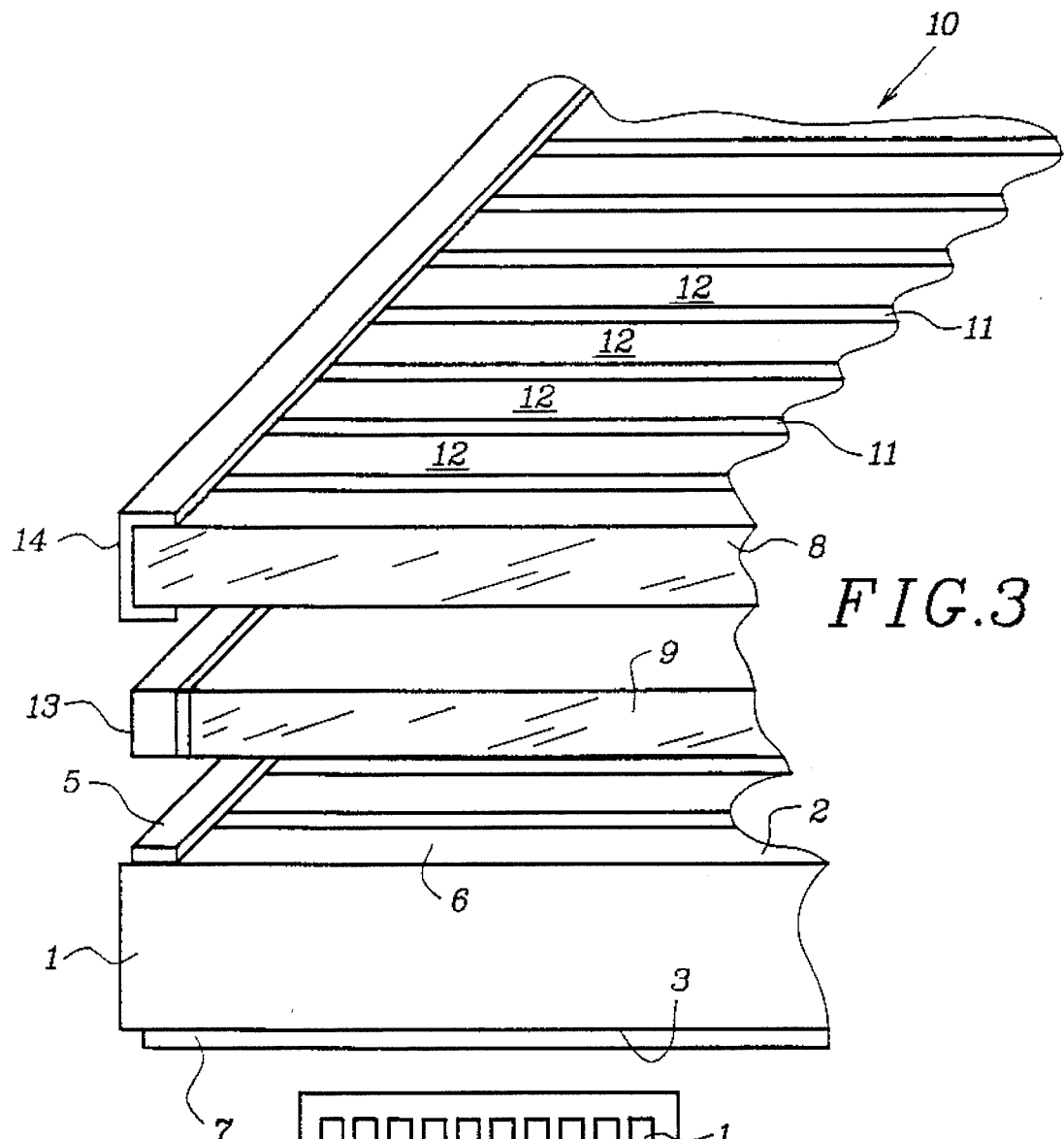
FIG. 3 is an exploded perspective view showing a detail of the FIG. 2 photocell.

In FIGS. 2 and 3, there can be seen a photocell of the invention including a circuit for drawing off electrostatic charge. This circuit comprises, on the outside face of the protective glass sheet 8, a grid 10 comprising a comb of conductive elements 11. The distance between the conductive elements 11 is small enough to enable electrostatic charge to be eliminated effectively so as to avoid any formation of electric arcs. The conductive elements are either made of metal, e.g. aluminum or silver, or else they are advantageously made of indium tin oxide which transmits 95% of the incident visible radiation. The conductive elements 11 are advantageously deposited by vacuum evaporation. Between the conductive elements 11, the protective glass sheet 8 comprises bare zones 12 which are not subjected to any light transmission loss due to the presence of conductive elements. In addition, the absence of conductors makes it possible to reduce the mass of the photocell by a small amount.

Advantageously, the grid of conductive elements 11 on the outside face of the protective glass sheet 8 is superposed over the electrode grid 4 on the first main face of the photocell 1. Thus, firstly losses due to light obscuration occur in the same place, thereby enabling the electrical power delivered by the photocell 1 to be increased, and secondly, it is possible to use the same mask for depositing the el3ectrode 4 and the grid of conductive elements 11 by vacuum evaporation. The circuit for drawing off electrostatic charge advantageously includes means for connecting the grid 10 of conductive elements 11 to the electrode 4, thereby avoiding the need to provide a dedicated ground connection circuit.

In the example shown in FIGS. 2 and 3, the connection is provided by a conductive strip or rectangular parallelepiped 13, e.g. made of tin alloy, that is placed between the busbar 5 of the electrode 4 and a channel section metal bar 14 surrounding the edge of the protective glass sheet 8.

Advantageously, the bar 14 is held resitiently on the edge of the protective glass sheet 8.

Advantageously, the bar 14 is soldered to the busbar 5 of the electrode 4 by raising the temperature while fixing the protective glass sheet 8 on the photocell 1.

Figure 4:
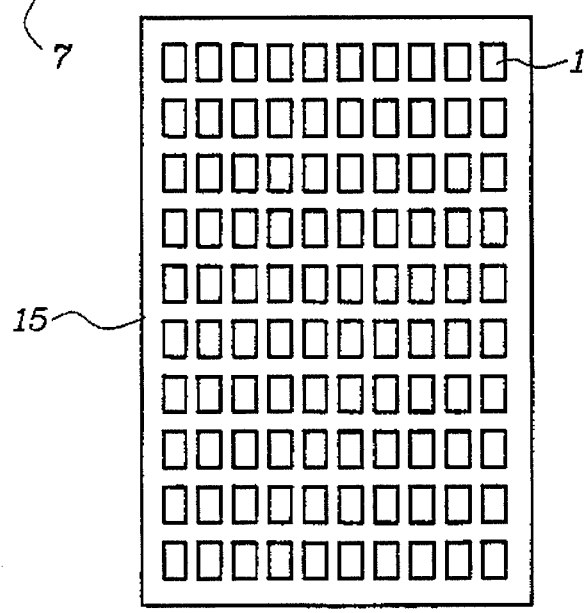
FIG. 4 is a plan view of a solar panel of the present invention.

FIG. 4 shows a solar panel 15, e.g. for use in space, that comprises a plurality of photocells 1 of the invention which are interconnected in series and/or in parallel to provide electrical power for a satellite, e.g. a telecommunications satellite.

Solar panels of the present invention are cheaper than panels for scientific research satellites and of considerably longer lifetime, with performance that is not degraded by the cycles of illumination and darkness to which telecommunications satellites are normally subjected.

There follow numerical examples of the performance of various embodiments of photocells of the present invention.

Thin layers of indium tin oxide typically transmit 95% of the incident solar light.

Example 1: grid 10 comprises reflecting metal elements 11 (metallic reflection): light transmission 0%, covered area 3% to 4% of the area of the protective glass sheet 8. Efficiency obtained: 96% to 97%.

Example 2: grid 10 having elements 11 made of 95% transparent indium tin oxide covering 3% to 4% of the outside surface of the protective glass sheet 8. Power obtained lying in the range 99.8% to 99.95% of the nominal power of the photocell without protection against static electricity.

In any event, the mass of the solar panels is reduced while simultaneously obtaining a significant increase in the delivered electrical power.

The present invention applies to making photocells and solar panels.

The main application of the present invention lies in making photocells and solar panels for use in space.

I claim:

1. A photocell comprising;

a photovoltaic body having a first main face carrying a first electrode for collecting current, and a second main face opposite its first main face and carrying a second electrode for collecting current; and a protective glass sheet bonded to said photovoltaic body;

the photocell including;

a grid of conductive elements for drawing off electrostatic charge and superposed over the elements of the first electrode, the grid being made of a substantially transparent material deposited on the outside face of the protective glass sheet and, means for interconnecting the first electrode and the grid for drawing off electrostatic charge comprising a channel section electrical conductor bar extending substantially along the entire length of the edge of the protective glass sheet and overlaying a busbar of the first electrode.

2. A photocell according to claim 1, wherein the substantially transparent grid of conductive elements for drawing off electrostatic charge is made of indium tin oxide.

3. A photocell according to claim 1, wherein the grid for drawing off electrostatic charge is deposited on the outside face of the protective glass sheet by vacuum evaporation.

4. A photocell according to claim 1, wherein the protective glass sheet is secured to the photovoltaic body by a film of PTFE whose thickness is in the range 20 μm to 50 μm.

5. A photocell according to claim 1, wherein the protective glass sheet is secured to the photovoltaic body by a film of PTFE whose thickness is in the range 25 μm to 50 μm.

6. A solar panel, in particular for use in space, comprising a plurality of photocells according to claim 1, connected in series and/or in parallel.

7. A photocell comprising;

a photovoltaic body having a first main face carrying a first electrode for collecting current, and a second main face opposite its first main face and carrying a second electrode for collecting current; and a protective glass sheet bonded to said photovoltaic body;

the photocell including;

a grid of conductive elements for drawing off electrostatic charge and superposed over the elements of the first electrode, the grid being made of a substantially transparent material deposited on the outside face of the protective glass sheet and, means for interconnecting the first electrode and the grid for drawing off electrostatic charge comprising a channel section electrical conductor bar extending substantially along the entire length of the edge of the protective glass sheet and overlaying a busbar of the first electrode, said channel section electrical conductor bar being held resiliently on the edge of the protective glass sheet.

8. A method of manufacturing a photocell, comprising the steps of:

a) placing a thin film of PTFE between a photovoltaic body and a protective glass sheet;

b) applying an intense electric field to press the glass sheet against the photovoltaic body;

c) heating the assembly to a high temperature until the protective glass sheet softens;

including the following steps prior to or during step a), of d) fixing, on one edge of the protective glass sheet, a conductive bar connected to a grid for drawing off charge;

e) placing solder on the edge of the PTFE film, the melting temperature of the solder being not greater than the heating temperature used during step c; and f) aligning both the solder and the conductive element connected to the grid for drawing off electrostatic charge with a busbar; such that when the temperature is raised during step c), the first electrode is connected to the grid for drawing off electrostatic charge and simultaneously the photovoltaic body is secured to the protective glass sheet.

* * * * *